(12) United States Patent
Maung (10) Patent No.: US 7,667,522 B1
(45) Date of Patent: Feb. 23, 2010

(54) LOW-SKEW DIGITAL LEVER SHIFTER FOR I/O

(75) Inventor: Leo Min Maung, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/330,986

(22) Filed: Dec. 9, 2008

Related U.S. Application Data (62) Division of application No. 11/534,628, filed on Sep. 22, 2006, now Pat. No. 7,477,086.

(51) Int. Cl.
*H03L 5/00* (2006.01)
(52) U.S. Cl. .............................. 327/333; 326/62; 326/80
(58) Field of Classification Search ............. 326/62–63, 326/80–81; 327/306, 333
See application file for complete search history.

(56) References Cited

U.S. PATENT DOCUMENTS

| | | | |
|---|---|---|---|
| 5,399,915 A | 3/1995 | Yahata | |
| 5,872,476 A | 2/1999 | Mihara et al. | |
| 5,909,134 A * | 6/1999 | Sohn et al. | 327/295 |
| 6,683,475 B2 | 1/2004 | Baker | |
| 6,774,695 B2 | 8/2004 | Hayashi et al. | |
| 6,809,554 B2 | 10/2004 | Wada | |
| 6,836,163 B2 | 12/2004 | Spehar | |
| 7,034,595 B2 * | 4/2006 | Lee | 327/233 |

* cited by examiner

*Primary Examiner*—Dinh T. Le
(74) *Attorney, Agent, or Firm*—Townsend and Townsend and Crew LLP; David B. Raczkowski (57) ABSTRACT

Circuits, methods, and apparatus for low-skew input/output level-shift circuits. One low-skew input/output circuit includes a single-ended-to-differential converter, a level-shift circuit, and a differential-to-single-ended converter. The circuit employs a low-skew single-ended-to-differential converter that provides an output to a level-shift circuit. To reduce skew, the single-ended-to-differential converter includes multiple paths from the input to its inverting and non-inverting outputs. The level-shift circuit translates signal levels between voltages used by the core and voltages used by the input and output circuits of the integrated circuit. An output from the level-shifter is received by the differential-to-single-ended converter. This converter also includes multiple signal paths coupling inverting and non-inverting signal paths. A threshold of an input inverter in the differential-to-single-ended converter is set by appropriately adjusting ratio of the size of its p-channel pull-up and n-channel pull-down transistors to match the rising and falling edges of the signals provided by the level-shift circuit.

13 Claims, 10 Drawing Sheets

DSP Block

LOW-SKEW DIGITAL LEVER SHIFTER FOR I/O

CROSS-REFERENCES TO RELATED APPLICATIONS

This non-provisional patent application is a divisional application of, and claims the benefit of, U.S. patent application Ser. No. 11/534,628, filed Sep. 22, 2006, the entire disclosure of which is incorporated by reference for all purposes.

BACKGROUND

The present invention relates generally to input/output circuits and more particularly to low-skew input/output level-shift circuits for integrated circuits.

Integrated circuit data rates and associated clock frequencies have been dramatically increasing the past few years, and the rate of this increase shows no signs of abating. Fortunately, circuit designers have developed various techniques for keeping pace. But these techniques place severe demands on the integrity of a device's data and clock signals.

For example, at double-data rate memory interfaces, data is transferred at each edge of a clock signal. To optimize data transfers, clock edges should have a very low level of skew between their rising and falling edges, since a high level of skew can impair device performance. As a comparison, when data is transferred at only one clock edge, rising and falling edge skew is more forgivable so long as the overall clock cycle period remains stable.

Similarly, it is desirable that rising and falling edges of data signals have low skew. Particularly in systems where data is to be recovered by a second integrated circuit, it is important that a first integrated circuit provide a data output having an open "eye" such that data can be accurately retimed.

But data and clock signals are typically handled on integrated circuits by inverters or similar logic gates. These circuits are inherently single-ended in nature, that is, they provide single-ended signals that are more prone to skew than differential signals. At its simplest, an inverter receiving a single-ended signal switches its output when an input signal crosses a threshold voltage. But skew results if the threshold does not match the cross point of the rising or falling edges of the input signal. The result is that the delay through an inverter for a rising edge may differ from the delay for a falling edge. This is particularly true when an input signal and a receiving inverter have different voltage ranges. For a clock signal, this can make double-data rate clocking more difficult. For data signals, this can close the "eye" needed for data recovery.

Thus, what is needed are circuits, methods, and apparatus for providing low-skew input and output level-shift circuits.

SUMMARY

Accordingly, embodiments of the present invention provide circuits, methods, and apparatus for low-skew input/output level-shift circuits. An exemplary embodiment provides a circuit that includes a single-ended-to-differential converter, a level-shift circuit, followed by a differential-to-single-ended converter. The circuit can receive signals being input to an integrated circuit and provide an output to its core. Alternately, the circuit may receive signals from a core and provide signals to an output of the integrated circuit. In other embodiments, the inputs and outputs may both be either coupled or directly connected to the core or to inputs or outputs of the device.

A specific embodiment of the present invention employs a low-skew single-ended-to-differential converter to translate a single-ended input signal to a differential signal for use by a following level-shift circuit. The single-ended-to-differential converter provides multiple paths from the input to its inverting and non-inverting outputs. In a specific embodiment of the present invention, back-to-back inverters are coupled between corresponding nodes in two series of inverters. In this way, the difference in the delay from an input to an inverting output and the delay from the input to a non-inverting output are matched and remain so over process, temperature, and voltage changes.

The level-shift circuit translates signal levels between voltage ranges used by the core and voltages used by the input and output circuits of the integrated circuit. When a low-skew circuit according to an embodiment of the present invention is used as an input circuit, the level shifter translates signals from the input and output voltage supplies to the core voltage supplies. Similarly, when a low-skew circuit according to an embodiment of the present invention is used as an output circuit, the level shifter translates signals from the core voltage supplies to the input and output voltage supplies.

In typical applications, the input and output voltage supplies are higher than the core supplies. However, device sizes are optimized for use in the core of the integrated circuits. Accordingly, special devices, such as thick oxide devices, can be made available to support the higher input and output voltages. When the level-shift circuit is translating signals from an input pad to the core, the level-shift circuit, the single-ended-to-differential converter, and other circuitry preceding the level-shift can be formed of thick oxide devices, though at least some of the differential-to-single-ended converter may use thick oxide devices as well. Similarly, when the level-shift circuit is translating signals from the core to an output, the level-shift circuit, the differential-to-single-ended converter, and other subsequent circuitry can be formed using thick oxide devices.

In a specific embodiment of the present invention, the output of the level-shift circuit is received by a differential-to-single-ended converter. The output of the differential-to-single-ended converter is buffered and gained using one or more inverters. The threshold of the inverters is set by appropriately adjusting ratio of the size of their p-channel pull-up and n-channel pull-down transistors. In an embodiment of the present invention, the thresholds can be set to match the rising and falling edges of the signals provided by the level-shifter. To prevent variations due to process, temperature, and voltage changes, the transistors of one or more inverters can be made of the same types of transistors as the level shifter, for example, they may be thick oxide devices.

In one embodiment, a matching inverter is placed at an unused output of the differential-to-single-ended converter such that each output of the differential-to-single-ended converter drives the same load.

Various embodiments of the present invention may incorporate one or more of these or the other features described herein. A better understanding of the nature and advantages of the present invention may be gained with reference to the following detailed description and the accompanying drawings.

DESCRIPTION OF EXEMPLARY EMBODIMENTS

Figure 1:
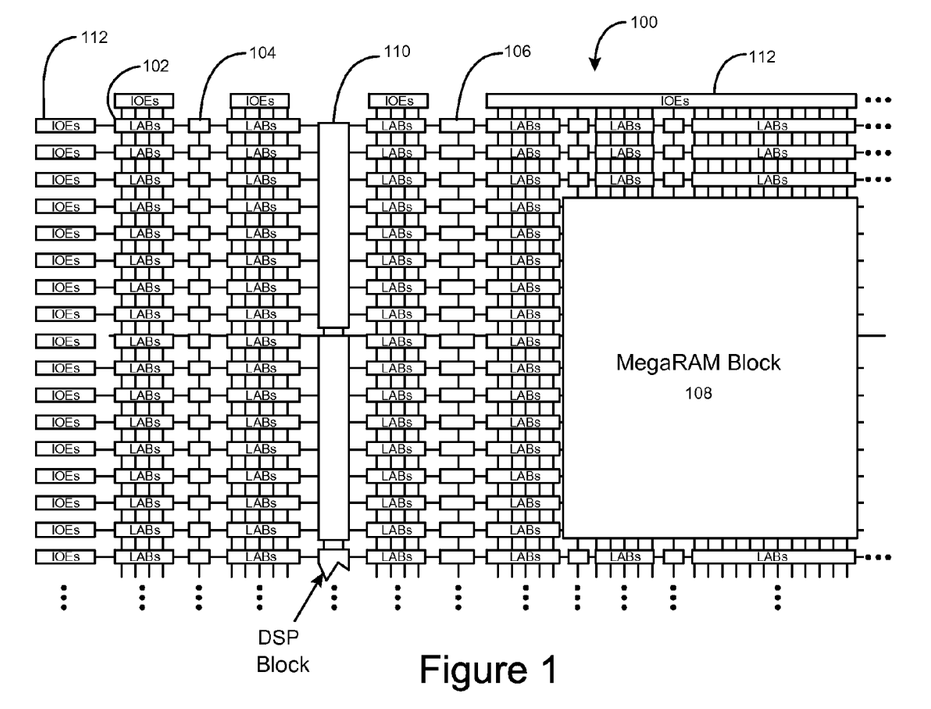
FIG. 1 is a simplified block diagram of a programmable logic device that is improved by incorporating embodiments of the present invention.

FIG. 1 is a simplified partial block diagram of an exemplary high-density programmable logic device 100 wherein techniques according to the present invention can be utilized. PLD 100 includes a two-dimensional array of programmable logic array blocks (or LABs) 102 that are interconnected by a network of column and row interconnections of varying length and speed. LABs 102 include multiple (e.g., 10) logic elements (or LEs), an LE being a small unit of logic that provides for efficient implementation of user defined logic functions.

PLD 100 also includes a distributed memory structure including RAM blocks of varying sizes provided throughout the array. The RAM blocks include, for example, 512 bit blocks 104, 4 K blocks 106, and an M-Block 108 providing 512 bits of RAM. These memory blocks may also include shift registers and FIFO buffers. PLD 100 further includes digital signal processing (DSP) blocks 110 that can implement, for example, multipliers with addition or subtraction features.

It is to be understood that PLD 100 is described herein for illustrative purposes only and that the present invention can be implemented in many different types of PLDs, FPGAs, and the other types of digital integrated circuits.

While PLDs of the type shown in FIG. 1 provide many of the resources required to implement system level solutions, the present invention can also benefit systems wherein a PLD is one of several components.

Figure 2:
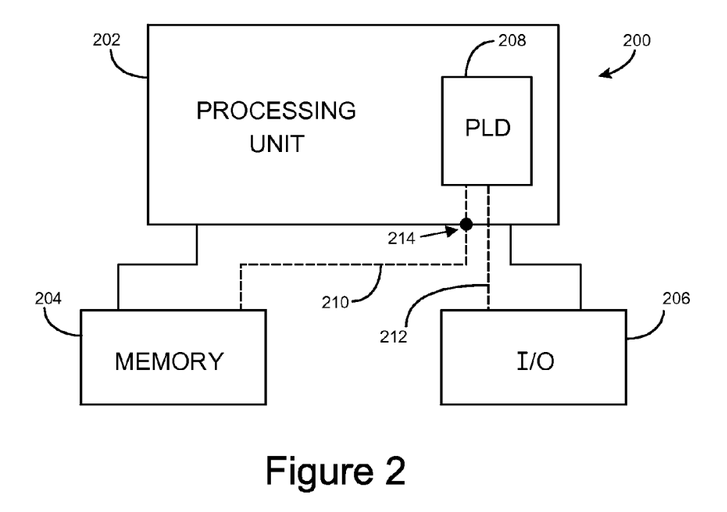
FIG. 2 is a block diagram of an electronic system that is improved by incorporating embodiments of the present invention.

FIG. 2 shows a block diagram of an exemplary digital system 200, within which the present invention may be embodied. System 200 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 200 may be provided on a single board, on multiple boards, or within multiple enclosures.

System 200 includes a processing unit 202, a memory unit 204 and an input/output unit 206 interconnected together by one or more buses. According to this exemplary embodiment, a programmable logic device (PLD) 208 is embedded in processing unit 202. PLD 208 may serve many different purposes within the system in FIG. 2. PLD 208 can, for example, be a logical building block of processing unit 202, supporting its internal and external operations. PLD 208 is programmed to implement the logical functions necessary to carry on its particular role in system operation. PLD 208 may be specially coupled to memory 204 through connection 210 and to input/output unit 206 through connection 212.

Processing unit 202 may direct data to an appropriate system component for processing or storage, execute a program stored in memory 204 or receive and transmit data via input/output unit 206, or other similar function. Processing unit 202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 208 can control the logical operations of the system. In an embodiment, PLD 208 acts as a reconfigurable processor, which can be reprogrammed as needed to handle a particular computing task. Alternately, programmable logic device 208 may itself include an embedded microprocessor. Memory unit 204 may be a random access memory (RAM), read only memory (ROM), fixed or flexible disk media, PC Card flash disk memory, tape, or any other storage means, or any combination of these storage means.

Figure 3:
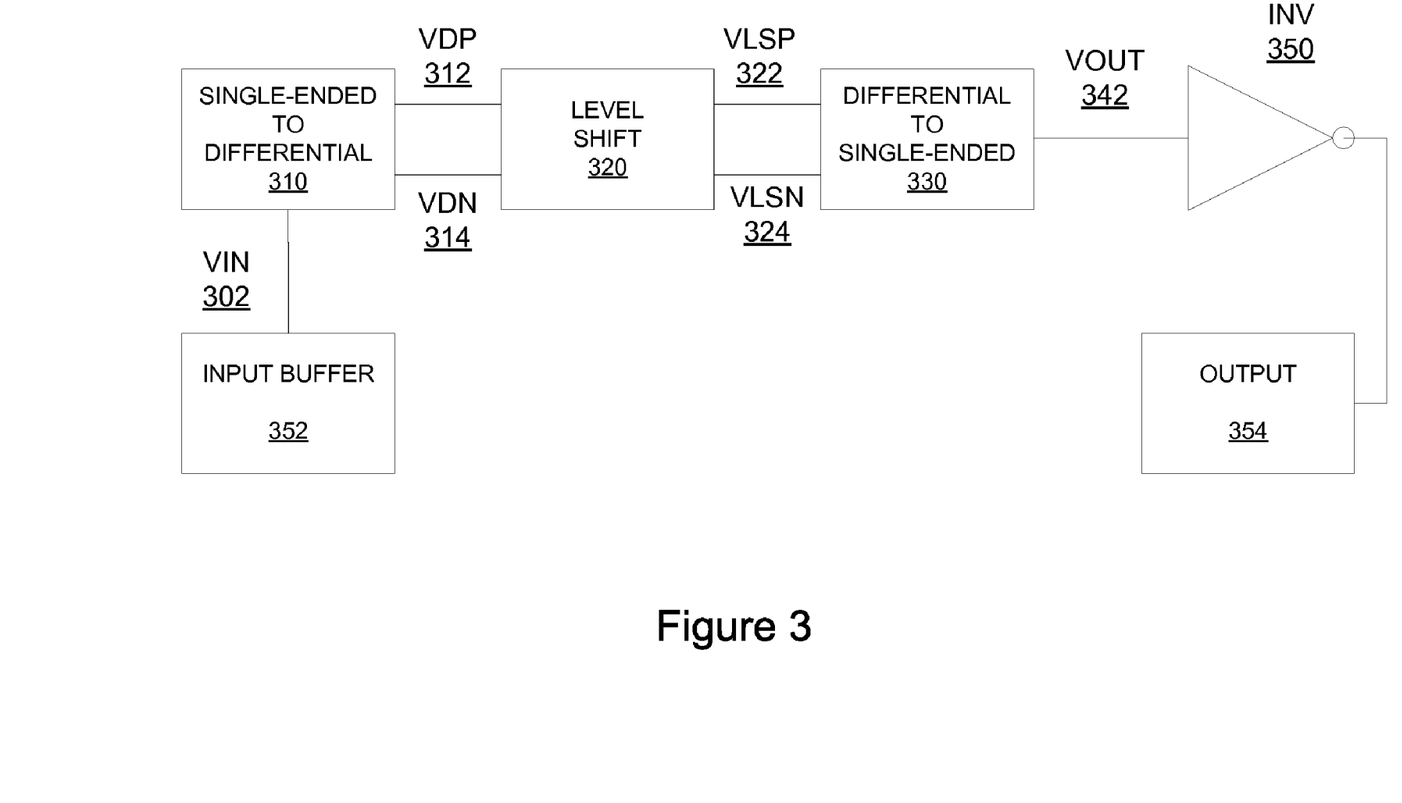
FIG. 3 is a schematic of an input/output level-shift circuit according to an embodiment of the present invention.

FIG. 3 is a schematic of an input/output circuit consistent with an embodiment of the present invention. The input/output circuit includes a single-ended-to-differential converter 310, level-shift circuit 320, and differential-to-single-ended converter 330. This and the other included figures are shown for exemplary purposes and do not limit either the possible embodiments of the present invention or the claims.

A single-ended input signal VIN is received on line 302 by the single-ended-to-differential converter 310. The signal VIN on line 302 may be received from a pad of an integrated circuit that includes these input/output circuits, or it may be received from an input buffer that is coupled to such a pad. Alternately, the signal VIN on line 302 may be received from one or more programmable logic elements or other internal circuitry, such as those circuits shown in FIG. 1. This signal may be received from such a circuit via a path formed by programmable interconnect lines.

The single-ended-to-differential converter 310 provides differential output signals VDP on line 312 and VDN on line 314 to the level-shift circuit 320. In this example, the signal VDP on line 312 is a non-inverting output, while the signal VDN on line 314 is an inverting output. That is, the polarity of the signal VDP on line 312 matches the polarity of the signal of VIN on line 302 (after a finite delay), while the polarity of the signal VDN on line 314 is an inversion of the polarity of the signal VIN on line 302.

The level-shift circuit 320 provides a change in signal voltage range between supply voltages used by the core circuitry and supply voltages used by the input/output circuitry outputs of the integrated circuit. If this circuit is used to provide a path into an integrated circuit, then the level shift 320 translates signals from the input/output supply voltage range to the supply voltage range. When the circuit is used to provide an output path, the level shift 320 translates signals from the core supply voltage range to the input/output supply voltage range.

Typically, the input/output supply voltage range is higher than the core supply voltage range. Accordingly, devices powered by the input/output supply voltage can be thick oxide transistors. For example, if the circuit is used as an input, the devices in the single-ended-to-differential converter 310 and level-shift circuit 320 can be thick oxide devices, while the remaining devices are thin—though some or all of the devices in the differential-to-single-ended converter 330 may be thick oxide to match the characteristics of the devices in the level-shift circuit 320. Similarly, if this circuit is used as an output, the level-shift circuit 320 and differential-to-single-ended converter 330 devices can be thick oxide devices, while the remaining devices are thin.

The outputs of the level-shift circuit 320 are the differential signals VLSP on line 322 and the VLSN on line 324. These signals are received by the differential-to-single-ended converter 330, which provides an output VOUT on line 342. Again, VOUT on line 342 may drive a pad directly, or be coupled to circuitry that drives a pad. In these various embodiments of the present invention, the signal VOUT on line 342 may have the same polarity as VIN on line 302, or it may have the opposite polarity.

Conventional single-ended-to-differential converters often provide outputs having skew between them. Specifically, the delay in a change in VDP on line 312 following a change in VIN on line 302 is different from a change in VDN on line 314 following the same event. This skew can cause duty cycle distortions, for example in a clock output. In such an application, where data rates are tremendously high, this skew can limit performance. Furthermore, while the delays through inverting and non-inverting paths in a single-ended-to-differential converter may be matched for a specific temperature, process, and supply voltage combination, skew may arise as one or more of these conditions change or vary.

Accordingly, embodiments of the present invention employ a single-ended-to-differential converter that provides multiple paths from the input to each output. This provides a differential output signal having a very low level of skew. An example is shown in the following figure.

Figure 4:
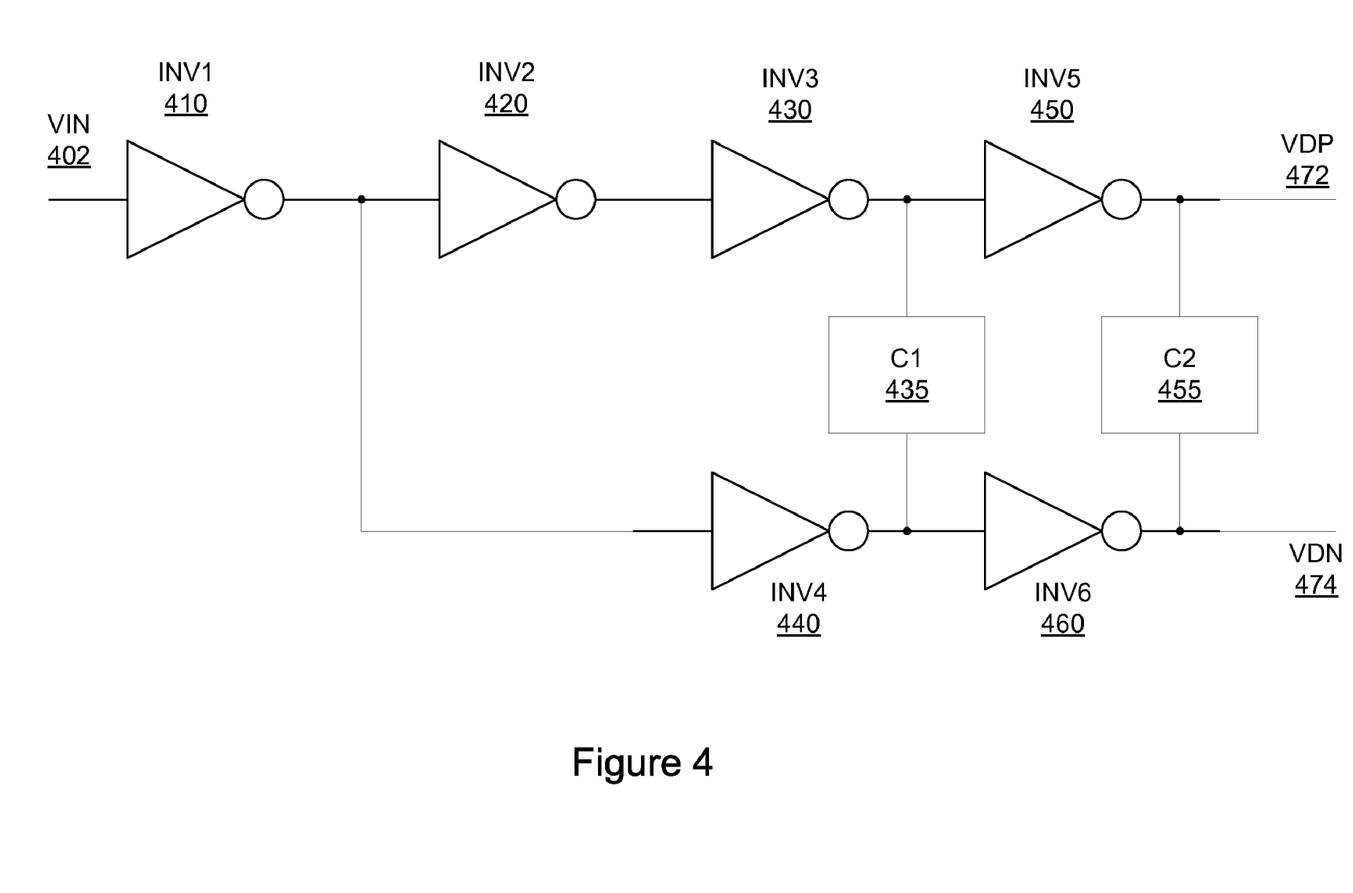
FIG. 4 is a schematic of a single-ended-to-differential converter according to an embodiment of the present invention.

FIG. 4 is a schematic of a single-ended-to-differential converter according to an embodiment of the present invention. This figure includes an input inverter INV1 410, a non-inverting signal path including inverters INV2 420, INV3 430, and INV5 450, an inverting path including inverters INV4 440 and INV6 460, and cross-coupling circuits C1 435 and C2 455.

The inverting and non-inverting paths are each shown as being formed by a number of inverters connected in series. In other embodiments of the present invention, one or more of these inverters may be replaced by buffers other inverting or non-inverting circuits having one or more inputs and outputs. While three inverters are shown in the non-inverting path and two inverters are shown in the inverting path, each may have any number of inverters or other circuits. Also, while the non-inverting path is shown as having one more inverter than the inverting path, the inverting path may include more inverters than the non-inverting path, though often these paths will differ by one inverter. Further, while coupling circuits C1 435 and C2 455 are shown as being connected to every appropriate node in these circuits, other embodiments of the present invention may use fewer coupling circuits and they may include a different number of cross-coupling circuits.

In the absence of the cross-coupling circuits C1 435 and C2 455, an input signal VIN is received on line 402 by a non-inverting path, which provides a non-inverting output VOUTP on line 472 and an inverting path, which provides an inverting output VOUTN on line 474. The non-inverting path in this example is made up of a series of four inverters, while the inverting path is made up of only three inverters (one input inverter, INV1 410 is common to each path). If each of these inverters is the same, a change in level of input signal VIN on line 402 propagates to the inverting output VOUTN on line 474 before it reaches VOUTP on line 472. This timing difference creates skew which can lead to rise and fall mismatches and duty cycle distortions in the differential output signal and later signals further in the signal path. Conventional solutions adjust the delays of one or more inverters such that the two paths have similar overall delays. For example, inverters INV2 420 and INV3 430 may be made faster to match the delay of inverter INV4 440. Unfortunately, even when these delays are matched at a particular temperature, process, and power supply, as one or more of these conditions vary, skew to at the output may result.

Accordingly, embodiments of the present invention employ a number of cross-coupling circuits, shown in this example as C1 435 and C2 455. These cross-coupling circuits provide alternate pathways from the input to VIN on line 402 to the outputs VOUTP on line 472 and VOUTN on line 474. A more specific implementation of a single-ended-to-differential converter according to an embodiment of the present invention is shown in the following figure.

Figure 5:
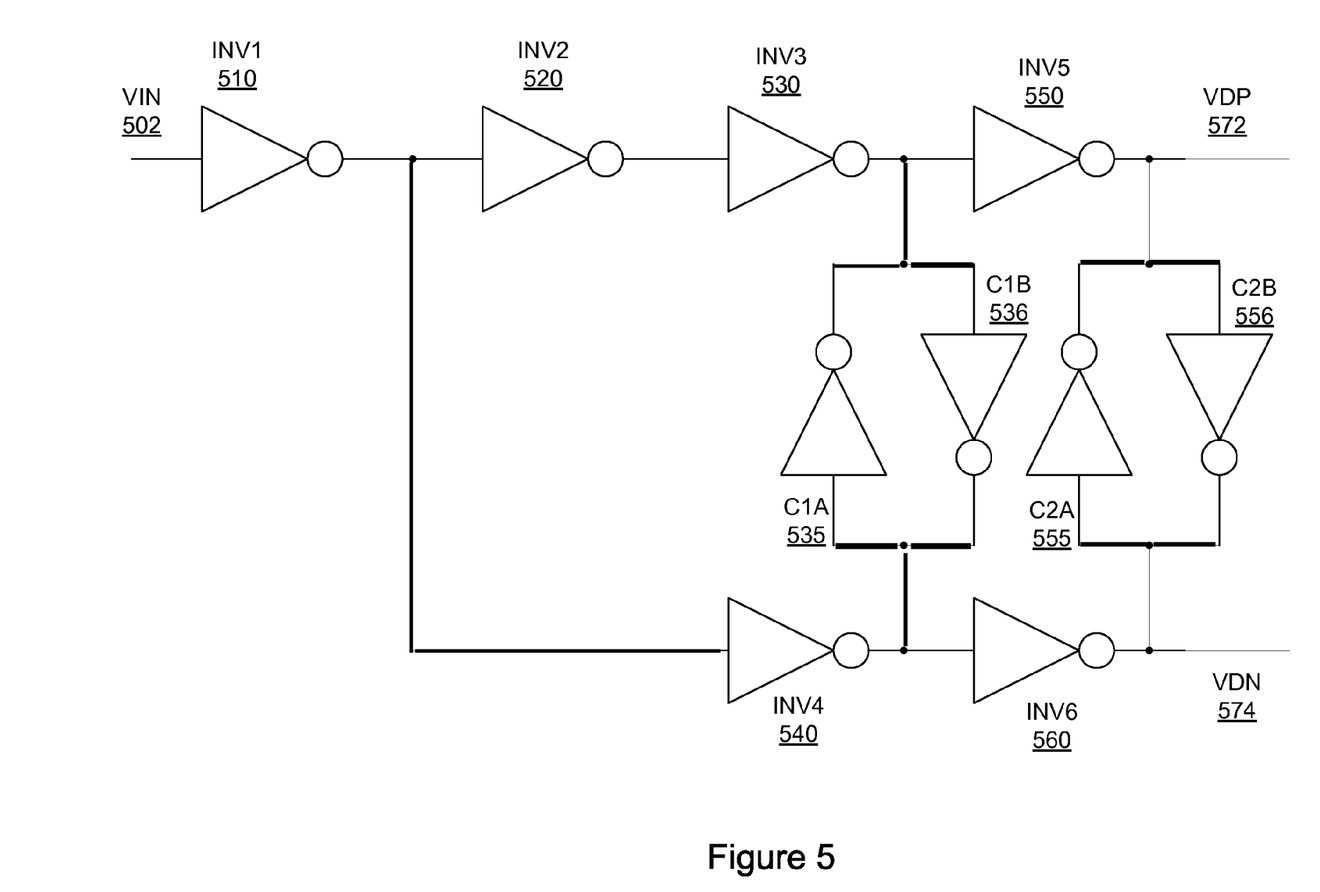
FIG. 5 is a more specific schematic of a single-ended-to-differential converter according to an embodiment of the present invention.

FIG. 5 is a more specific schematic of a single-ended-to-differential converter according to an embodiment of the present invention. This figure includes an input inverter INV1 510, a non-inverting path including inverters INV2 520, INV3 530, and INV5 550, and an inverting path including inverters INV4 540 and INV6 560, and cross-coupling circuits including C1A 535, C1B 536, C2A 555, and C2B 556.

In this example, the cross-coupling circuits are back-to-back inverters, such as inverters C1A 535 and C1B 536. These inverters provide inverting paths between the output nodes of each of the inverters in the inverting and non-inverting paths. By coupling the signals in the two paths in this manner, skew between the paths is reduced significantly. Diagrams explaining this further are shown in the following two figures.

Figure 6A:
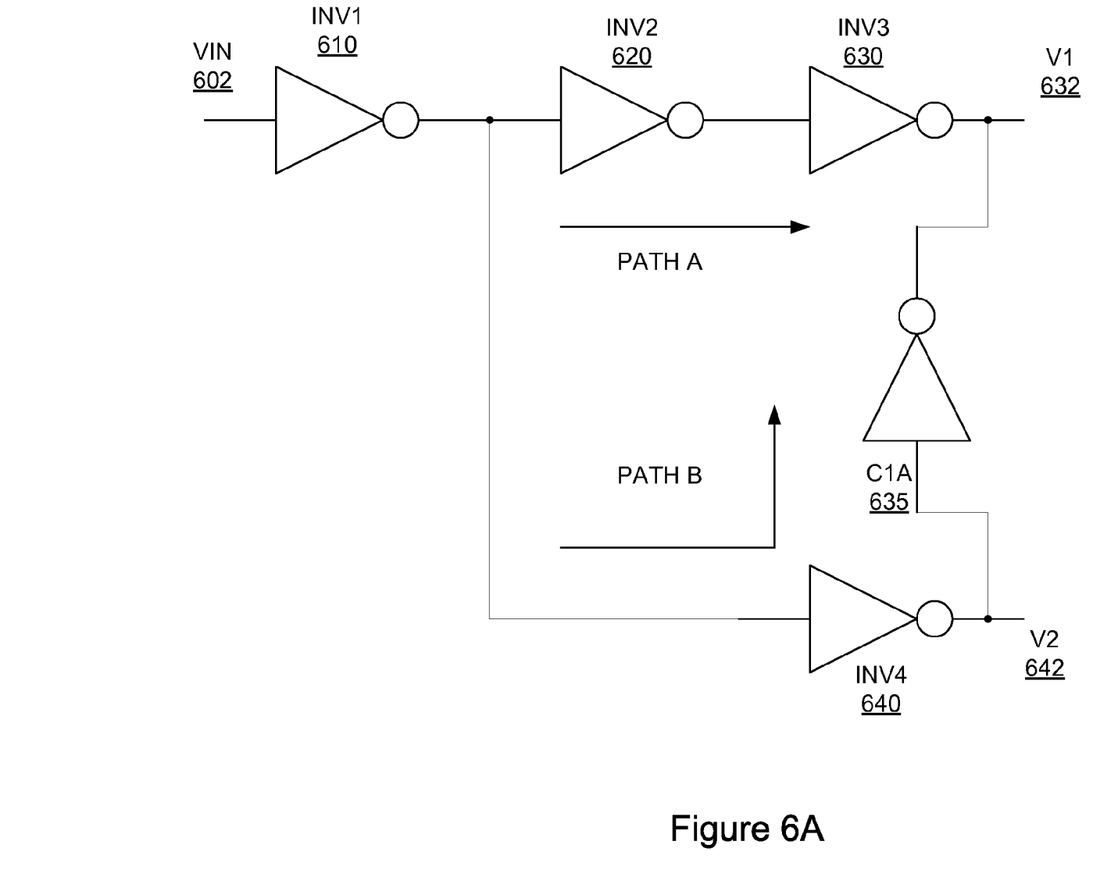
FIG. 6A illustrates the operation of one half of the coupling circuit formed by inverters C1A 535 and C1B 536 in FIG. 5.

FIG. 6A illustrates the operation of one half of the coupling circuit formed by inverters C1A 535 and C1B 536 in FIG. 5. Specifically, the operation of inverter C1A 635 is shown. C1A 635 provides an alternate path from the input signal VIN on line 602 to the output of inverter INV2 620. In this example, the signal VIN on line 602 propagates to V1 on line 622 using two paths, Path A and Path B. Path A includes inverter INV2 620 and inverter INV3 630, while Path B includes inverter INV4 640 and inverter C1A 635. The delay through each of these paths is two inverter delays long, that is the delay from VIN on line 602 to V1 on line 622 corresponds to two paths of two inverters each.

Figure 6B:
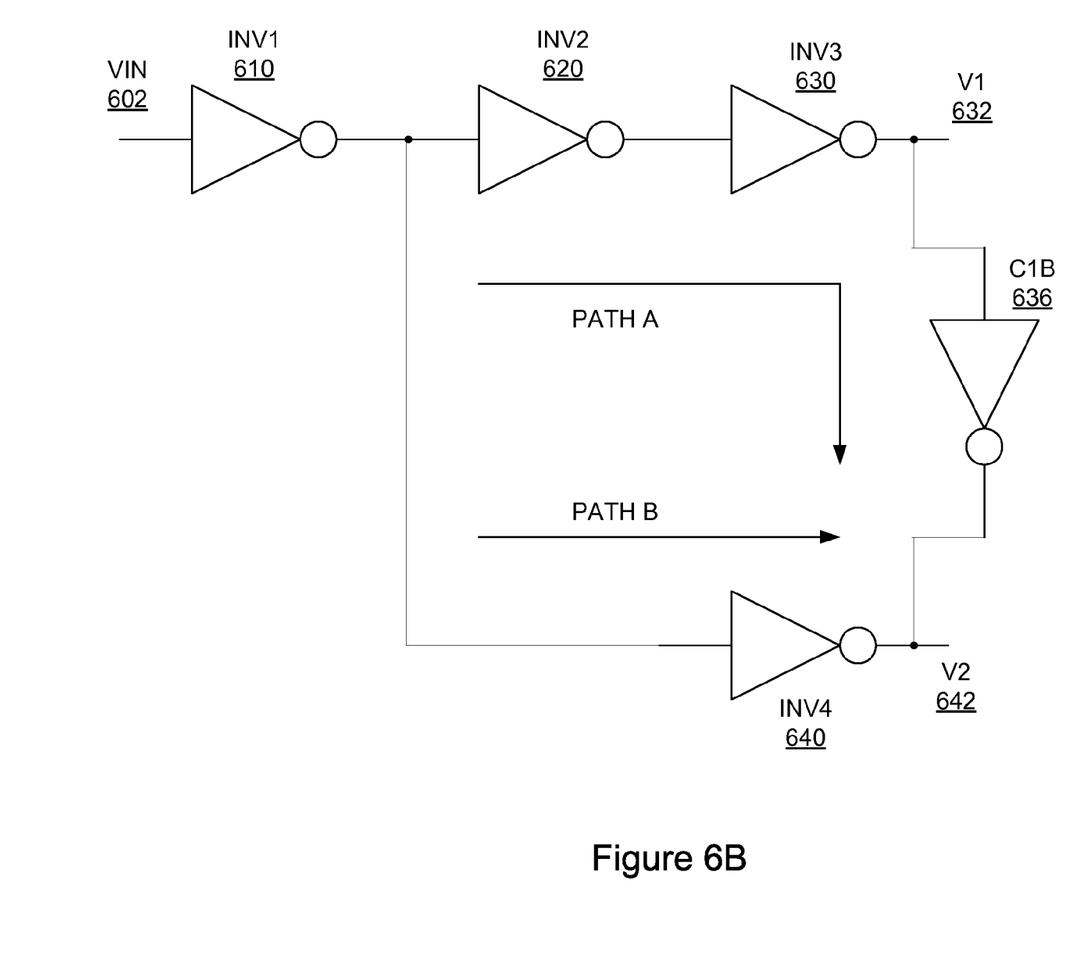
FIG. 6B illustrates the operation of the other half of the coupling circuit C1A 535 and C1B 536 in FIG. 5.

FIG. 6B illustrates the operation of the other half of the coupling circuit C1A 535 and C1B 536 in FIG. 5. Specifically, the contribution of inverter C1B 636 is shown. Again, changes in the signal VIN on line 602 propagate to node V2 632 via two paths, Path A and Path B.

Path A includes the inverters INV2 620, INV3 630, and C1B 636. Path A is shorter, only one inverter long, specifically INV4 640. Accordingly, the signal propagation from VIN on line 602 to V1 on line 632 can be thought of as a composite of two paths, one path consisting of one inverter, the other including three inverters. The coupling inverter creates a contention that holds the voltage at node V2 642 until the input signal propagates through Path A. This slows the signal at V2 642 and prevents the inverting path of the single-ended-to-differential converter from racing ahead of the non-inverting path.

Since Path A is the path that dominates or controls the signal level at node V2 642, and Path A includes one extra inverter, changes in the signal level at node V2 642 may lag changes in the signal level at node V1 632. The difference in timing is due to the delay through the inverter C1B 636. This residual skew can be reduced by using multiple stages, as shown in FIGS. 4 and 5.

The inverters C1A 635 and C1B 636 provide further synchronization in that as a change in V1 on line 632 results in a change in V2 on line 642 via inverter C1B 636. Similarly, a change in V2 on line 642 propagates to V1 on line 632 via inverter C1A 635 (not shown). The coupling inverters between subsequent stages provide similar functions. That is, the two coupling inverters act as a latch providing positive feedback in driving the two nodes V1 632 and V2 642. Again, after one or more stages, the skew in the inverting and non-inverting paths is greatly reduced using these coupling inverters.

The device sizes in the inverters shown should be carefully adjusted to provide optimum performance. For example, the coupling inverters should be made large enough to hold a signal in a path having fewer inverters such that it does not outrace a path with more inverters. For example, in FIG. 6B, inverter C1B 636 should be sized large enough to cause contention, that is, to hold the signal at V2 642 until the input signal propagates though Path A. However, if inverters C1A and C1B are excessive in size, the back-to-back inverters form a latch that holds present signal levels and prevents signals from propagating down the inverting and non-inverting paths. Also, each inverter in the inverting and non-inverting paths may be the same size, or one or more may be progressively larger to increase the drive capability of the circuit.

This low-skew differential output is useful for many applications, including level shifting, for example, between input/output and core voltage ranges, or other voltage ranges. When level shifting is done using single-ended signals, a large amount of skew may result. Specifically, it is difficult to match an inverter threshold to received signals where the signal and inverter have different voltage ranges, particularly where the voltage ranges may vary relative to each other. Accordingly, an embodiment of the present invention uses the above single-ended-to-differential converter and a differential level-shift circuit to level shift signals. An example of a differential level-shift circuit is shown in the following figure.

Figure 7:
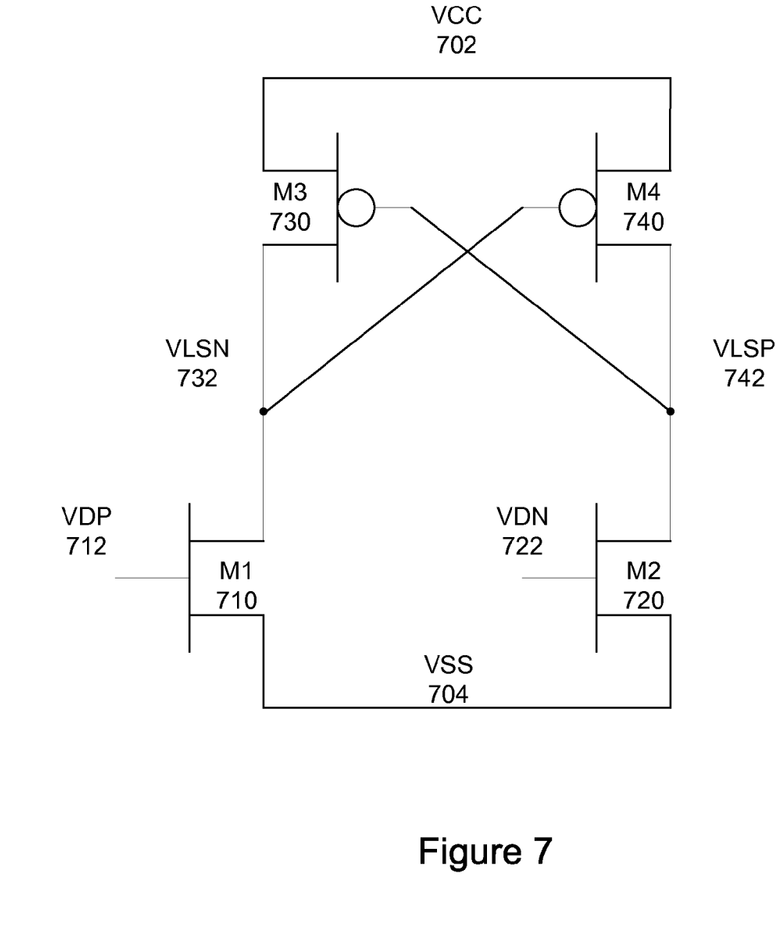
FIG. 7 is a schematic of a level-shift circuit according to an embodiment of the present invention.

FIG. 7 is a schematic of a level-shift circuit according to an embodiment of the present invention. This circuitry includes pull-down transistors M1 710 and M2 720, and cross-coupled pull-up devices M3 730 and M4 740. A differential signal VDP on line 712 and VDN on line 722 is received at the gates of transistors M1 710 and M2 720. These transistors turn on in an alternating fashion and switch the cross coupled transistors M3 730 and M4 740, resulting in a differential output signal between VLSP on line 742 and VLSN on line 732.

Specifically, when the voltage at the gate of M1 710 is high, M1 710 conducts, thereby pulling the gate of transistor M4 740 low. This causes M4 740 to turn on, pulling the voltage VLSP on line 742 to VCC on line 702. This in turn turns off transistor M3 730. Similarly, when the voltage at the gate of M2 720 is high, M2 720 conducts, thereby pulling the gate of transistor M3 730 low. This causes M3 730 to turn on, pulling the voltage VLSN on line 732 to VCC on line 702.

The voltage swing of VDP on line 712 and VDN on line 722 may be an appropriate voltage swing such that transistors M1 710 and M2 720 alternate between conducting and non-connecting states, and the gate-breakdown voltage of transistors M1 710 and M2 720 are not exceeded. For this reason, one or more of the transistors M1 710, M2 720, M3 730, and M4 740 can be thick oxide transistors.

Figure 8:
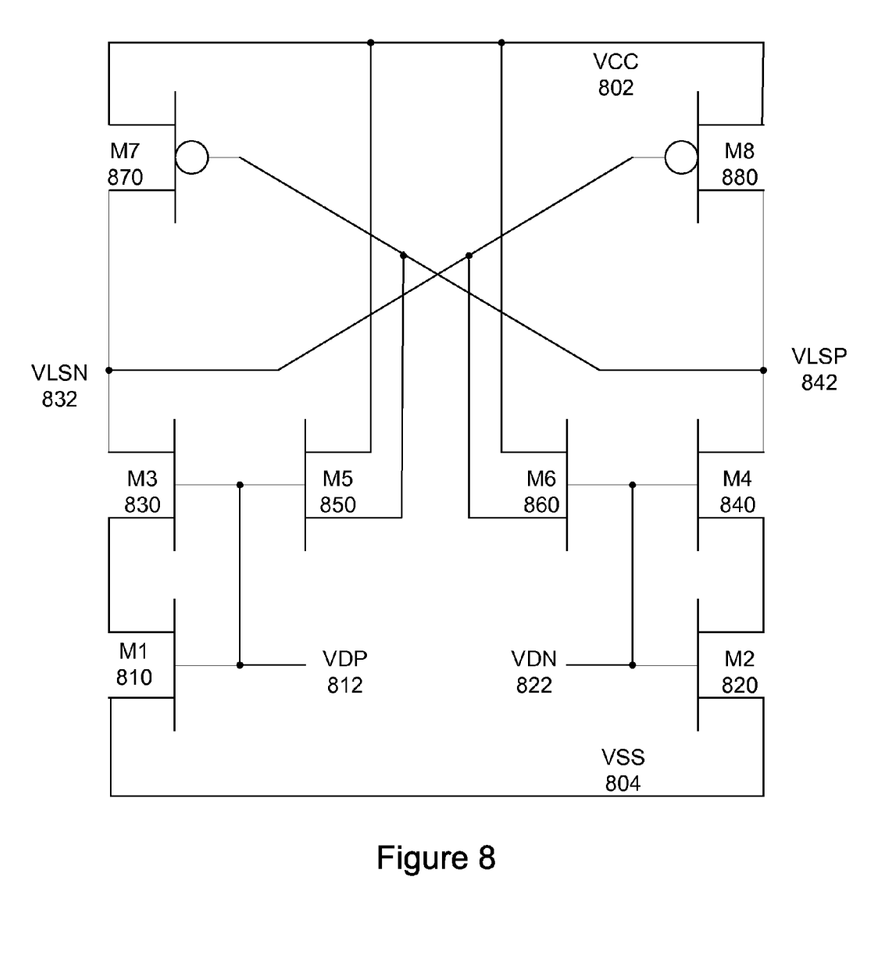
FIG. 8 is a schematic of another level-shift circuit according to an embodiment of the present invention.

FIG. 8 is a schematic of another level-shift circuit according to an embodiment of the present invention. This level-shift circuit includes pull-down transistors M1 810 and M2 820, stacked devices M3 830 and M4 840, pull-up devices M5 850 and M6 860, and cross-coupled pull-up devices M7 870 and M8 880. Again, one or more of these devices may be thick-oxide devices. A differential signal VDP on line 812 and VDN on line 822 is received at the gates of transistors M1 810 and M2 820. These transistors turn on in an alternating fashion and switch the cross coupled transistors M7 870 and M8 880, resulting in a differential output signal between VLS9 on line 842 and VLSN on line 832. Specifically, when the voltage at the gate of M1 810 is high, M1 810 and M3 830 conduct, thereby pulling the gate of transistor M8 880 low. This causes M8 880 to turn on, pulling the voltage VLSP on line 842 to VCC on line 802. This in turn turns off transistor M7 870. At this time M5 850 also conducts, pulling up on the gate of M7 870, turning it off more rapidly. Similarly, when the voltage at the gate of M2 820 is high, M2 820 and M4 840 conduct, thereby pulling the gate of transistor M7 870 low. This causes M7 870 to turn on, pulling the voltage VLSN on line 832 to VCC on line 802, which, along with M6 860, turn off M8 880.

Figure 9:
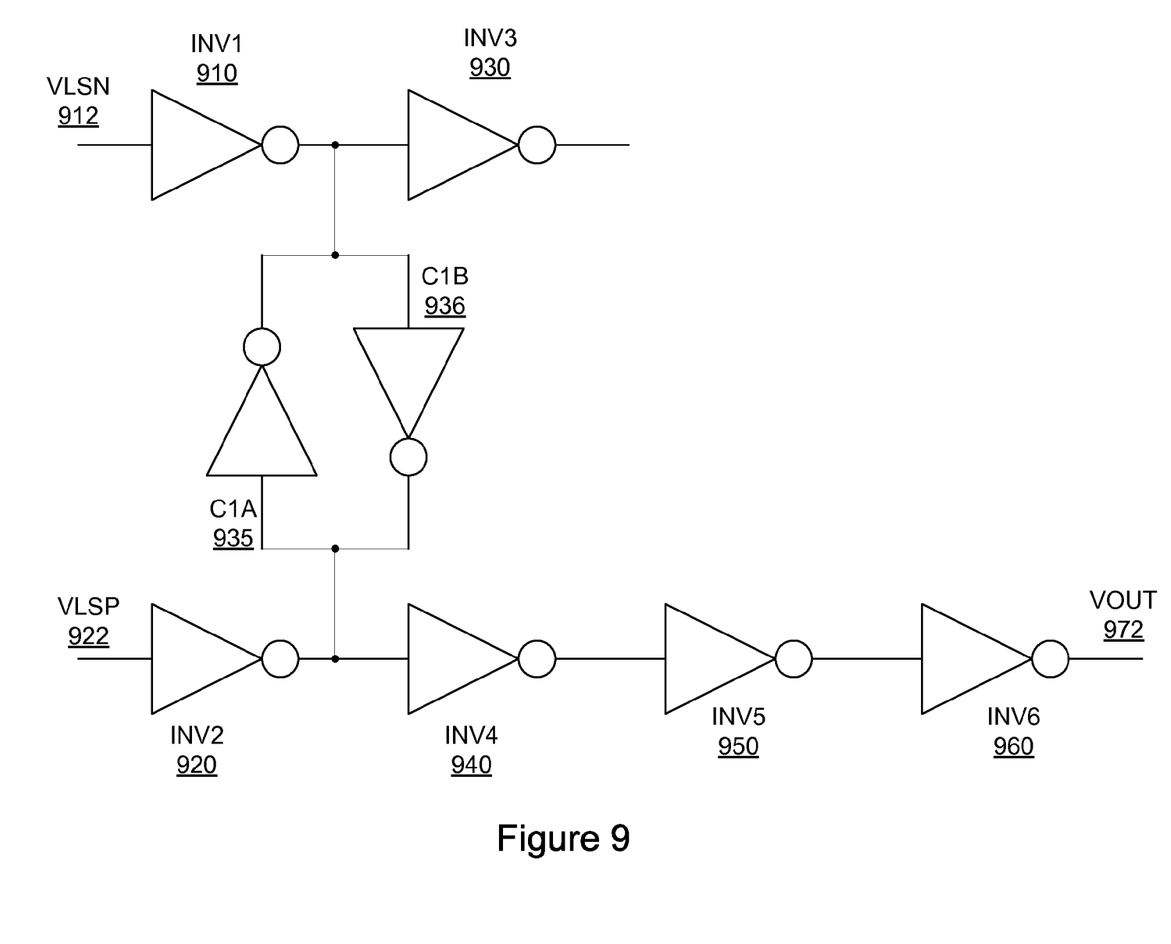
FIG. 9 is a schematic of a differential-to-single-ended converter according to an embodiment of the present invention.

FIG. 9 is a schematic of a differential-to-single-ended converter according to an embodiment of the present invention. This converter includes an output path including inverters INV2 920, INV4 940, INV5 950, and INV6 960, a dummy or matching series of inverters INV1 910 and INV3 930, and coupling inverters C1A 935 and C1B 936. As with the single-ended-to-differential converter, this differential-to-single-ended converter can include other numbers of inverters, the numbers shown are but one example.

The output signal VLSP on line 922 is received by inverter INV2 920, which in turn drives inverter INV4 940, followed by INV5 950 and INV6 960. The sizes of the devices in INV2 920 may be scaled to match the waveform on line VLSP 922. Specifically, the threshold of the pull-up and pull-down devices of INV2 920 may be ratioed or scaled such that the threshold of inverter INV2 920 is placed at the cross points of the high-going and low-going transitions of the signal VLSP on line 922. Again, to prevent this match from drifting with changes in process, temperature, and voltage, the devices in INV2 920 may be chosen to match the devices in the level-shift circuit 320. The inverters INV4 940, INV5 950, and INV6 960 gain the signal provided by INV2 920, thereby increasing and sharpening the edge rates of VOUT on line 972.

Inverter INV1 910 is included such that the load on VLSN on line 912 matches the load on VLSP on line 922. Coupling inverters C1A 935 and C1B 936 act to remove or reduce any residual skew coming out of the level-shift circuit 320. The operation of these inverters is the same as explained in FIGS. 6A and 6B above. INV3 930 is included to act as a matching load for C1A 935. The sizes of the devices of INV1 910 and INV2 920 should typically match, and should be scaled as to not excessively load the level-shift circuit 320. The sizes of the devices of INV3 930 and INV4 940 should also match, and may be the same size as INV2 920, or they may be scaled larger for increased drive strength. In some embodiments, they may alternately be smaller.

The above figures illustrate specific circuitry that may be used by embodiments of the present invention. In other embodiments, other circuitry may be used. For example, input or output circuitry connected to the inputs or the outputs of the above circuits may be used to receive or transmit signals from or to other integrated circuits. These embodiments can handle a periodic signal such as a data, or periodic signals such as clock or strobe signals. A method of receiving and providing such signals is shown in the following figure.

Figure 10:
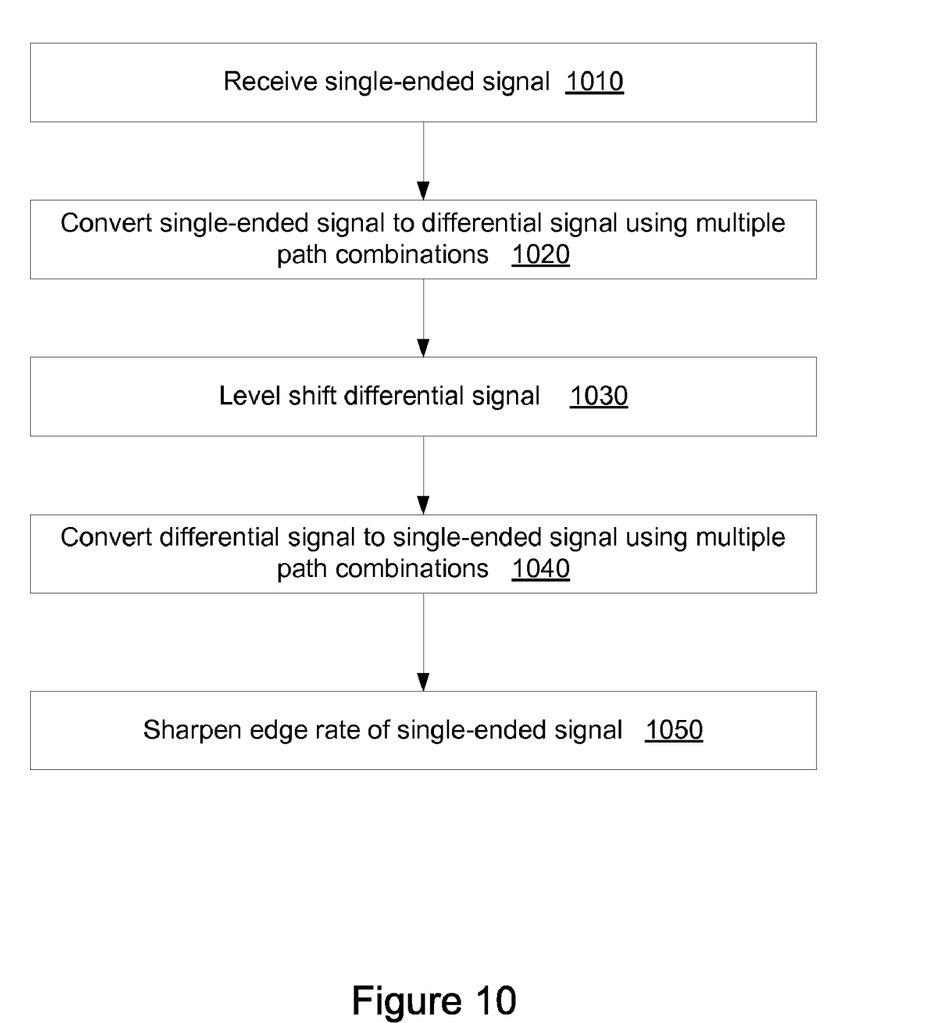
FIG. 10 is a flowchart of a method of providing a signal having a low skew according to an embodiment of the present invention.

FIG. 10 is a flowchart of a method of providing a signal having a low skew according to an embodiment of the present invention. In this embodiment, a single-ended signal is received and a differential signal having inverting and non-inverting outputs with a low skew between them are generated. The differential signal is level shifted and converted to a single-ended signal. The single-ended signal can then be gained such that its edge rates are increased.

Specifically, in act 1010, a first single-ended signal is received. In act 1020, the first single-ended signal is converted to a differential signal using combinations of multiple signal paths. In act 1030, the differential signal is level shifted, and in act 1040 it is converted to a second single-ended signal, again using combinations of multiple signal paths. As shown above, acts 1030 and 1040 may be performed by the same circuitry. In act 1050, the edge rate of the second single-ended signal is sharpened.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising a single-ended-to-differential converter comprising:
   a first series of inverters comprising:
      a first inverter coupled to receive an input signal;
      a last inverter coupled to provide a non-inverted output signal; and
      a plurality of first intermediate inverters coupled in series between the first inverter and the last inverter of the first series;
   a second series of inverters comprising:
      a first inverter coupled to receive the input signal;
      a last inverter coupled to provide an inverted output signal; and
      one or more second intermediate inverters coupled in series between the first inverter and the last inverter of the second series, the second intermediate inverters being different than the first intermediate inverters;
   a first plurality of coupling inverters, each having an input coupled to an output of a respective inverter in the first series and an output coupled to an output of a respective inverter in the second series;
   a second plurality of coupling inverters, each having an input coupled to an output of a respective one of the respective inverters in the second series and an output coupled to an output of a respective one of the respective inverters in the first series; and
   a plurality of programmable logic elements configurable to implement user-defined logic functions,
   wherein the first inverter in the first series of inverters and the first inverter in the second series of inverters receive the input signal from at least one of the programmable logic elements.

2. The integrated circuit of claim 1 further comprising:
   a level-shift circuit having a first input coupled to an output of the last inverter in the first series of inverters and a second input coupled to an output of the last inverter in the second series of inverters.

3. The integrated circuit of claim 1 wherein the integrated circuit is a field programmable gate array.

4. The integrated circuit of claim 1, wherein the first inverter in the first series of inverters is the same inverter as the first inverter in the second series of inverters.

5. The integrated circuit of claim 1, wherein at least one of the first plurality of coupling inverters is coupled between outputs of one of the first intermediate inverters and one of the second intermediate inverters.

6. The integrated circuit of claim 1, wherein at least one of the second plurality of coupling inverters is coupled between outputs of the last inverter of the first series and the last inverter of the second series.

7. An integrated circuit comprising a single-ended-to-differential converter comprising:
   a first series of inverters comprising:
      a first inverter coupled to receive an input signal;
      a last inverter coupled to provide a non-inverted output signal; and
      a plurality of first intermediate inverters coupled in series between the first inverter and the last inverter of the first series;
   a second series of inverters comprising:
      a first inverter coupled to receive the input signal;
      a last inverter coupled to provide an inverted output signal; and
      one or more second intermediate inverters coupled in series between the first inverter and the last inverter of the second series the second intermediate inverters being different than the first intermediate inverters;
   a first plurality of coupling inverters, each having an input coupled to an output of a respective inverter in the first series and an output coupled to an output of a respective inverter in the second series;
   a second plurality of coupling inverters, each having an input coupled to an output of a respective one of the respective inverters in the second series and an output coupled to an output of a respective one of the respective inverters in the first series; and
   a plurality of programmable logic elements configurable to implement user-defined logic functions,
   wherein the first inverter in the first series of inverters and the first inverter in the second series of inverters receive the input signal from an input circuit, the input circuit coupled to an integrated circuit pad.

8. The integrated circuit of claim 7 further comprising:
   a level-shift circuit having a first input coupled to an output of the last inverter in the first series of inverters and a second input coupled to an output of the last inverter in the second series of inverters.

9. The integrated circuit of claim 7 wherein the integrated circuit is a field programmable gate array.

10. The integrated circuit of claim 7, wherein the first inverter in the first series of inverters is the same inverter as the first inverter in the second series of inverters.

11. The integrated circuit of claim 7, wherein at least one of the first plurality of coupling inverters is coupled between outputs of one of the first intermediate inverters and one of the second intermediate inverters.

12. The integrated circuit of claim 7, wherein at least one of the second plurality of coupling inverters is coupled between outputs of the last inverter of the first series and the last inverter of the second series.

13. The integrated circuit of claim 7, wherein the last inverter in the first series of inverters and the last inverter in the second series of inverters both have outputs coupled to at least one of the programmable logic elements.

* * * * *